United States Patent [19]

Jacobs

[11] Patent Number: 4,511,996
[45] Date of Patent: Apr. 16, 1985

[54] MEMORY CELL HAVING A DOUBLE GATE FIELD EFFECT TRANSISTOR AND A METHOD FOR ITS OPERATION

[75] Inventor: Erwin Jacobs, Vaterstetten, Fed. Rep. of Germany

[73] Assignee: Siemens Aktiengesellschaft, Berlin & Munich, Fed. Rep. of Germany

[21] Appl. No.: 406,718

[22] Filed: Aug. 9, 1982

[30] Foreign Application Priority Data

Sep. 30, 1981 [DE] Fed. Rep. of Germany ....... 3138947

[51] Int. Cl.³ ............................................. G11C 11/40
[52] U.S. Cl. .................................... 365/186; 365/182; 365/218
[58] Field of Search ................ 365/174, 182, 186, 218

[56] References Cited

U.S. PATENT DOCUMENTS 4,330,850  5/1982  Jacobs et al. ........................ 365/185

Primary Examiner—Terrell W. Fears
Attorney, Agent, or Firm—Hill, Van Santen, Steadman & Simpson

[57] ABSTRACT

A memory cell comprises a double gate field effect transistor which exhibits source and drain regions located in a semiconductor body and two gate electrodes covering the semiconductor area between the source and drain regions, the gate electrodes being separated from the semiconductor body by a multilayer insulation. The first gate electrode is a memory gate, whereas inversion layers are produced with the second gate electrode given supply of a gate voltage, the inversion layers extending the source and drain regions in the direction towards the memory gate. The structure provides a surface-saving design of a selection element. The second gate electrode is employed for this purpose as the selection element and is connected to a selection line (word line). The invention finds application in very large scale integrated semiconductor memories.

10 Claims, 3 Drawing Figures

MEMORY CELL HAVING A DOUBLE GATE FIELD EFFECT TRANSISTOR AND A METHOD FOR ITS OPERATION

BACKGROUND OF THE INVENTION

1 Field of the Invention

The present invention relates to a memory cell having a double gate field effect transistor which exhibits a doped semiconductor body of a first conductivity type into which a source region and a drain region of a second conductivity type are located, and also exhibiting two separately drivable gate electrodes covering the semiconductor area between the source and drain regions, whereby the edge zones of the second gate electrode cover those portions of the semiconductor area lying outside of the first gate electrode and extending up to the source and drain regions, and which also exhibits a multilayer gate insulation separating at least the first gate electrode from the semiconductor body. The same is chargeable with an electrical charge shifting the threshold voltage.

2 Description of the Prior Art

A memory cell of the type generally set forth above is extensively described in the German published application No. 29 18 888, corresponding to U.S. Pat. No. 4,330,850, fully incorporated herein by this reference. The multilayer gate insulation of the double gate transistor comprises a tunnel oxide layer ($SiO_2$), a silicon nitride layer ($Si_3N_4$) lying above the tunnel oxide layer, and an oxynitride layer covering the silicon nitride layer. Located thereon are the two gate electrodes in two polysilicon levels lying above one another. The first gate electrode serves as a so-called memory gate, whereas the second electrode is employed for the production of inversion layers at the boundary surface of the semiconductor body which respectively extend the source and drain regions in the direction towards the first gate electrode. A transistor having such inversion layers is also referred to as an ICT transistor (inversion charge transistor). The storage of a logical information occurs in such a manner that negative charges are agglomerated at the boundary surface nitride/oxide or, respectively, in the nitride due to a positive voltage of sufficient size supplied to the memory gate, the negative charge shifting the threshold voltage of the transistor. The logical information is again erased by an erase method referred to as short channel erase. When reading from the memory cell, a determination is made as to whether or not the threshold voltage is shifted.

In this known memory cell, a selection transistor is provided whose source/drain segment switches the source/drain of the double gate field effect transistor to the assigned source line. The gate terminal of the selection transistor is connected to a selection line (word line). This, however, means a greater expense of semiconductor surface for the (selectable) memory cell, since it is constructed as a socalled two-transistor cell.

SUMMARY OF THE INVENTION

The object of the present invention, therefore, is to provide a memory cell of the type set forth above which can be realized on a smaller semiconductor surface.

According to the invention, the above object is achieved by providing that the second electrode is connected to a selection line and serves as a selection element which prepares the transistor for writing, reading or erasing of logical information.

The advantage which may be attained in practicing the present invention is that the selection of the memory cell occurs over the second gate electrode connected to a selection line so that the selection transistor of the known memory cell is eliminated. A gate line for the second gate electrode therefore assumes the function of a selection line (word line).

According to a feature of the invention, a semiconductor memory has a plurality of such monolithically integrated memory cells and is characterized in that a group of the memory cells are respectively connected by way of their second gate electrodes to a common selection line (word line).

According to another feature of the invention, for writing a logical information, the source and the drain region are applied to a reference potential, the first gate electrode is connected to a programming voltage, and a selection voltage is supplied to the second gate electrode, and, for the purpose of reading the stored information, the source region is connected to reference potential, the drain region is connected to a drain voltage, the first gate electrode is connected to a read voltage which switches the field effect transistor into its conductive condition only given a non-shifted threshold voltage, and the selection voltage is supplied to the second gate electrode. Furthermore, for the purpose of erasing a written logical information, the source and drain regions are respectively provided with a constant erase voltage, the first gate electrode is connected to a reference potential, and the selection voltage is supplied to the second gate electrode.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
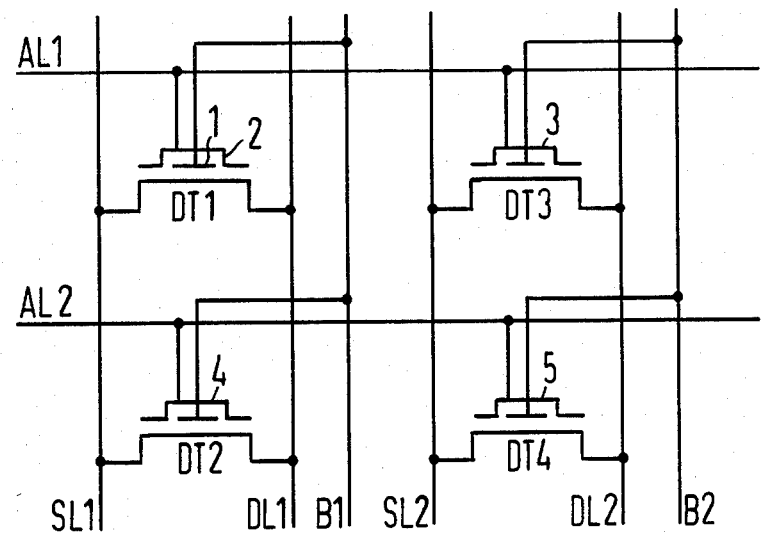
FIG. 1 is a basic circuit diagram of a memory array comprising four memory cells constructed in accordance with the present invention.

Referring to FIG. 1, a 2×2 memory matrix is illustrated which comprises four memory cells constructed in accordance with the present invention, selection lines and drive lines. When one considers the memory cell lying in the left column in the upper row, the memory cell comprising a double gate transistor DT1, then the source terminal of DT1 is connected to a source line SL1, the drain terminal is connected to a drain line DL1, and the first gate electrode 1 of the transistor DT1 is connected to a bit line B1. The corresponding elements of the double gate transistor DT2 of the left, lower memory cell likewise are connected to the respective lines SL1, DL1 and B1. In an analogous manner, the source terminals of the double gate transistor DT3 and DT4 of the right column are connected to a source line SL2, the drain terminals are connected to a drain line DL2, and the respective first gate electrodes are connected to a bit line B2. The second electrodes 2, 3 of the transistors DT1 and DT3 are connected to a common selection line (word line) AL1, whereas the second gate electrodes 4, 5 of the transistors DT2 and DT4 are connected to a common selection line (word line) AL2. The second gate electrodes 2—5 are also referred to as "inversion charge transistor gates".

For the selection of the memory cells of the upper row, the selection line AL1 is provided with a selection voltage of, for example, 10 volts. At the transistors DT1 and DT3, this leads to the formation of inversion layers below those elements of the second gate electrodes, for example the electrode 2, which lie outside of the first gate electrodes, for example the electrode 1, and cover the semiconductor regions between the latter and the respective source and drain regions.

Figure 2:
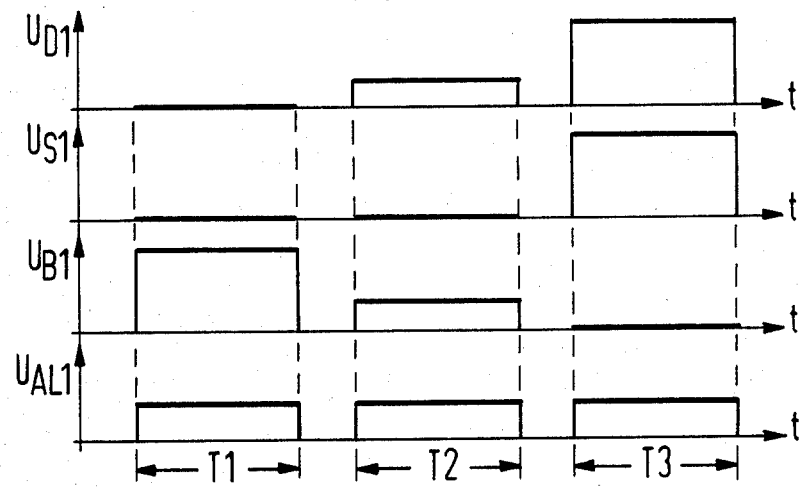
FIG. 2 is a plurality of voltage/time diagrams for explaining the manner of operation of a memory cell of the type illustrated in FIG. 1.

Given each of the double gate transistors lying in the selected row, a logical information can be written, read or erased by driving the source, drain and bit lines assigned thereto. In an overview, FIG. 2 illustrates the time progressions of voltages which are to be supplied to a memory cell, for example, the upper left memory cell of FIG. 1, during operation. A logical information is to be written in the time interval T1. To this end, the lines DL1 and SL1 are connected to a reference potential and the bit line B1 is provided with a programming voltage $U_{B1}$ of, for example, 20 volts. In the time interval T2 in which the stored information is read, the source line SL1 is connected to a reference potential, whereas the drain line is connected to a drain voltage $U_{D1}$ of, for example, 5 volts and the bit line B1 has a (read) voltage $U_{B1}$ of, for example, 5 volts applied thereto. Erasing the stored information in a time interval T3 proceeds in such a manner that the bit line B1 is connected to a reference potential, whereas a source voltage $U_{S1}$ and a drain voltage $U_{D1}$ of approximately 20 volts, respectively, are supplied over the lines SL1 and DL1, these voltages also being referred to as erase voltages. In all of the time intervals T1—T3, a selection voltage $U_{AL1}$ of approximately 10 volts is supplied over the selection line AL1 to the second gate electrode 2 of the selected double gate transistor DT1.

Figure 3:
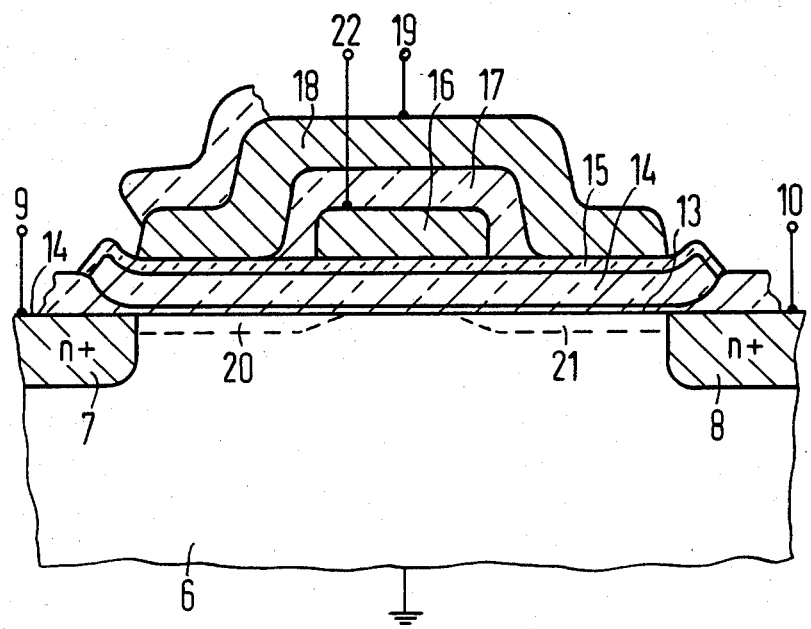
FIG. 3 is a sectional view of a preferred exemplary embodiment of a double gate transistor serving as a memory cell.

FIG. 3 illustrates a double gate transistor according to FIG. 1, for example, the transistor DT1, in a sectional view. A $n^+$-doped source region 7 and a $n^+$-doped drain region 8 are provided with respective terminals 9 and 10 and are located within a semiconductor body 6 of a first conductivity type comprising, for example, p-doped silicon which is connected to a reference potential. A 3 nm thick tunnel oxide layer 13 is applied to the boundary surface 11 in the area between the regions 7 and 8, the tunnel oxide layer 13 being covered by a silicon nitride layer having a layer thickness of approximately 40 nm. An oxynitride layer of approximately 10 nm thickness is provided at 15 over the silicon nitride layer 14. A first gate electrode 16, comprising polycrystalline silicon, is located on the oxynitride layer 15, the first gate electrode 16 being separated from a second gate electrode 18, also comprising polycrystalline silicon, by an insulating intermediate layer 17 the gate electrode 18 thereby covers those portions of the semiconductor body lying outside of the gate electrode 16 and which extend up to the source and drain regions 7 and 8. When a voltage $U_{AL1}$ (FIG. 2) lying above the threshold voltage is applied to the terminal 19 of the electrode 18, then inversion layers 20 and 21 are formed which extend the regions 7 and 8 in the direction toward the gate 16. The gate 16 is provided with a terminal 22 to which the voltage $U_{B1}$ (FIG. 2) is supplied.

Although I have described my invention by reference to particular illustrative embodiments thereof, many changes and modifications of the invention may become apparent to those those skilled in the art without departing from the spirit and scope of the invention. I therefore intend to include within the patent warranted hereon all such changes and modifications as may reasonably and properly be included within the scope of my contribution to the art.

I claim:

1. In a transistor memory cell of the type in which a semiconductor body of a first conductivity type has a boundary surface, in which a semiconductor source region of an opposite second conductivity type and a semiconductor drain region of the second conductivity type are located spaced apart in the semiconductor body at the boundary surface and adapted to receive selected operating potentials for writing, reading and erasing, in which a first gate electrode is carried insulated over a first portion of the boundary surface and thereby defines second portions of the boundary surface which extend between the first portion and the source and drain regions, the first gate electrode adapted for connection to a bit line to receive selected potentials for writing, reading and erasing, including potentials effective to produce an electrical charge shift of the threshold voltage of the transistor, and in which selection means connected in circuit with the transistor is operable in response to selection signals to prepare the memory cell for writing, reading and erasing, the improvement wherein the selection means comprises:

a second gate electrode carried insulated over said first gate electrode and extending over said second portions of said boundary surface and adapted for connection to a selection line to receive a selection potential effective to create inversion layers in said semiconductor body below said second portions of said boundary surface to effectively extend said source and drain regions towards said first gate electrode and prepare the transistor for writing, reading and erasing.

2. A single transistor memory cell comprising:
a semiconductor body of a first conductivity type and having a boundary surface;
a semiconductor source region of an opposite second conductivity type and a semiconductor drain region of the second conductivity type located spaced apart in said semiconductor body at said boundary surface and adapted to receive selected operating potentials for writing, reading and erasing;
a first gate electrode carried insulated over a first portion of said boundary surface and thereby defining second portions of said boundary surface which extend between said first portion and said source and drain regions, said first gate electrode adapted for connection to a bit line to receive selected potentials for writing, reading and erasing, including potentials effective to produce an electrical charge shift of the threshold voltage of the transistor; and
a second gate electrode carried insulated over said first gate electrode and extending over said second portions of said boundary surface and adapted for connection to a selection line to receive a selection potential effective to create inversion layers in said semiconductor body below said second portions of said boundary surface to effectively extend said source and drain regions towards said first gate electrode and prepare the transistor for writing, reading and erasing.

3. The single transistor memory cell of claim 2, wherein:
said first conductivity type is p-conductivity.

4. The single transistor memory cell of claim 2, wherein:
said second conductivity type is $n^+$-conductivity.

5. The single transistor memory cell of claim 2, and further comprising:
polycrystalline silicon constituting said first gate electrode.

6. The single transistor memory cell of claim 2, and further comprising:
polycrystalline silicon constituting said second gate electrode.

7. A single transistor memory cell comprising:
a p-conductivity semiconductor body having a boundary surface; an $n^+$-conductivity semiconductor source region and an $n^+$-conductivity semiconductor drain region located spaced apart in said semiconductor body at said boundary surface and adapted to receive selected operating potentials for writing, reading and erasing;
a first gate electrode carried insulated over a first portion of said boundary surface and thereby defining second portions of said boundary surface which extend between said first portion and said source and drain regions, said first gate electrode adapted for connection to a bit line to receive selected potentials for writing, reading and erasing, including potentials effective to produce an electrical charge shift of the threshold voltage of the transistor; and
a second gate electrode carried insulated over said first gate electrode and extending over said second portions of said boundary surface and adapted for connection to a selection line to receive a selection potential effective to create inversion layers in said semiconductor body below said second portions of said boundary surface to effectively extend said source and drain regions towards said first gate electrode and prepare the transistor for writing, reading and erasing.

8. A single transistor memory cell comprising:
a p-doped silicon body having a boundary surface; an $n^+$-doped source region and an $n^+$-doped drain region located spaced apart in said semiconductor body at said boundary surface and adapted to receive selected operating potentials for writing, reading and erasing;
a first polycrystalline silicon gate electrode carried insulated over a first portion of said boundary surface and thereby defining second portions of said boundary surface which extend between said first portion and said source and drain regions, said first gate electrode adapted for connection to a bit line to receive selected potentials for writing, reading and erasing, including potentials effective to produce an electrical charge shift of the threshold voltage of the transistor; and
a second polycrystalline silicon gate electrode carried insulated over said first gate electrode and extending over said second portions of said boundary surface and adapted for connection to a selection line to receive a selection potential effective to create inversion layers in said semiconductor body below said second portions of said boundary surface to effectively extend said source and drain regions towards said first gate electrode and prepare the transistor for writing, reading and erasing.

9. A single transistor memory cell comprising:
a p-doped silicon body having a boundary surface;
an $n^+$-doped source region and an $n^+$-doped drain region located spaced apart in said semiconductor body at said boundary surface and adapted to receive selected operating potentials for writing, reading and erasing;
a tunnel oxide layer carried on and covering said boundary surface, a silicon nitride layer carried on said tunnel oxide layer and an oxynitride layer carried on said silicon nitride layer;
a first polycrystalline silicon gate electrode carried on said oxynitride layer over a first portion of said boundary surface and thereby defining second portions of said boundary surface which extend between said first portion and said source and drain regions, said first gate electrode adapted for connection to a bit line to receive selected potentials for writing, reading and erasing, including potentials effective to produce an electrical charge shift of the threshold voltage of the transistor;
an insulating layer covering said first polycrystalline silicon gate electrode; and
a second polycrystalline silicon gate electrode carried on said insulating layer over said first gate electrode and extending over said tunnel oxide, silicon nitride and oxynitride layers above said second portions of said boundary surface and adapted for connection to a selection line to receive a selection potential effective to create inversion layers in said semiconductor body below said second portions of said boundary surface to effectively extend said source and drain regions towards said first gate electrode and prepare the transistor for writing, reading and erasing.

10. A semiconductor memory comprising:
a plurality of memory cells arranged in an array of columns and rows;
a plurality of control lines for receiving signals for effecting writing, reading and erasing, including a source line, a drain line and a bit line for each column and a selection line for each row;
each of said memory cells comprising a semiconductor body of a first conductivity type including a boundary surface;
a source of an opposite, second conductivity type and a drain of the second conductivity type located spaced apart in said semiconductor body at said boundary surface and connected to respective source and drain lines;
a first gate connected to a respective bit line and carried insulated over said boundary surface between said source and drain to define a first portion of said boundary surface therebelow and second portions which extend between said first portion and said source and said drain; and
a second gate connected to a respective selection line and carried insulated over said first gate and extending over said second portions of said boundary surface, said second gate responsive to a selection potential to effectively extend said source and said drain towards said first gate to prepare said memory cell for writing, reading and erasing.

* * * * *